US009090799B2

(12) United States Patent
Shinoda et al.

(10) Patent No.: US 9,090,799 B2
(45) Date of Patent: Jul. 28, 2015

(54) COMPOSITION FOR POLISHING AND METHOD OF POLISHING SEMICONDUCTOR SUBSTRATE USING SAME

(75) Inventors: Toshio Shinoda, Kiyosu (JP); Kayoko Nagahara, Kiyosu (JP); Yutaka Inoue, Kiyosu (JP); Shuhei Takahashi, Kiyosu (JP); Toshihiro Miwa, Kiyosu (JP)

(73) Assignee: FUJIMI INCORPORATED, Kiyosu-shi (JP)

( * ) Notice: Subject to any disclaimer, the term of this patent is extended or adjusted under 35 U.S.C. 154(b) by 108 days.

(21) Appl. No.: 13/882,280

(22) PCT Filed: Nov. 7, 2011

(86) PCT No.: PCT/JP2011/075543
§ 371 (c)(1),
(2), (4) Date: Jun. 13, 2013

(87) PCT Pub. No.: WO2012/063757
PCT Pub. Date: May 18, 2012

(65) Prior Publication Data
US 2013/0260650 A1 Oct. 3, 2013

(30) Foreign Application Priority Data
Nov. 8, 2010 (JP) ................... 2010-250249

(51) Int. Cl.
B24B 1/00 (2006.01)
C09G 1/02 (2006.01)
H01L 21/02 (2006.01)
B24B 31/00 (2006.01)

(52) U.S. Cl.
CPC ............... *C09G 1/02* (2013.01); *B24B 31/003* (2013.01); *H01L 21/02024* (2013.01)

(58) Field of Classification Search
CPC ...... B24B 1/00; B24B 31/116; B24B 37/042; B24B 37/04; H01L 21/30625; C09K 3/1463; C09G 1/02
USPC ............. 451/41, 60, 446; 51/308; 216/88, 89; 106/3, 441, 450, 499
See application file for complete search history.

(56) References Cited

U.S. PATENT DOCUMENTS

| 3,874,129 | A | * | 4/1975 | Deckert et al. ................. 451/41 |
| 5,403,619 | A | * | 4/1995 | Cuomo et al. ............. 427/248.1 |
| 6,012,969 | A | * | 1/2000 | Ryoke et al. ................... 451/41 |
| 6,195,372 | B1 | * | 2/2001 | Brown ............................ 372/34 |
| 6,238,272 | B1 | * | 5/2001 | Tanaka et al. .................. 451/41 |
| 6,767,476 | B2 | * | 7/2004 | Wang et al. ..................... 216/88 |
| 7,014,539 | B1 | * | 3/2006 | Charatan ........................ 451/56 |
| 7,534,277 | B2 | * | 5/2009 | Roh et al. ........................ 51/308 |
| 8,353,740 | B2 | * | 1/2013 | Ward et al. ..................... 451/36 |
| 8,546,261 | B2 | * | 10/2013 | Kim et al. ..................... 438/692 |
| 2002/0004360 | A1 | * | 1/2002 | Ota et al. ........................ 451/60 |
| 2002/0139055 | A1 | * | 10/2002 | Asano et al. .................... 51/308 |
| 2005/0070211 | A1 | * | 3/2005 | Bian ................................ 451/36 |
| 2005/0258139 | A1 | * | 11/2005 | Nojo et al. ....................... 216/88 |
| 2009/0111359 | A1 | * | 4/2009 | Suzuki et al. ................... 451/36 |
| 2009/0253355 | A1 | * | 10/2009 | Koyama et al. ................. 451/41 |
| 2009/0267021 | A1 |  | 10/2009 | Nakajo et al. |
| 2009/0298393 | A1 | * | 12/2009 | Kozasa ............................ 451/41 |
| 2010/0022171 | A1 | * | 1/2010 | Naguib et al. .................. 451/41 |
| 2010/0081281 | A1 | * | 4/2010 | Babu et al. ..................... 438/693 |
| 2014/0141612 | A1 | * | 5/2014 | Miller et al. ................... 438/693 |
| 2014/0287586 | A1 | * | 9/2014 | Matsui et al. .................. 438/692 |

FOREIGN PATENT DOCUMENTS

| JP | 05-154760 A | 6/1993 |
| JP | 2000-129243 A | 5/2000 |
| JP | 2004-335722 A | 11/2004 |
| JP | 2008-124223 A | 5/2008 |
| JP | 2009-218288 A | 9/2009 |
| JP | 2009-263484 A | 11/2009 |

* cited by examiner

*Primary Examiner* — George Nguyen
(74) *Attorney, Agent, or Firm* — Foley & Lardner LLP

(57) ABSTRACT

Provided is a polishing composition containing abrasive grains, at least one type of alcohol compound selected from the group consisting of aliphatic alcohols with 2 to 6 carbon atoms and glycol ethers with 3 to 10 carbon atoms, at least one type of basic compound selected from the group consisting of quaternary ammonium salts and alkali metal salts, and water. The average primary particle diameter of the abrasive grains is 5 to 50 nm. The content of the alcohol compound in the polishing composition is 0.01 to 1% by mass. The polishing composition is mainly used in an application of polishing a semiconductor substrate surface.

12 Claims, No Drawings

COMPOSITION FOR POLISHING AND METHOD OF POLISHING SEMICONDUCTOR SUBSTRATE USING SAME

TECHNICAL FIELD

The present invention relates to a polishing composition mainly used in an application of polishing a semiconductor substrate, such as a silicon wafer, with a polishing pad, and also relates to a method for polishing a semiconductor substrate using the polishing composition.

BACKGROUND ART

Generally in polishing of a semiconductor substrate, such as a silicon wafer, not only improvement of surface quality in accordance with realization of higher performance and higher integration density of semiconductor devices but improvement of manufacturing efficiency for accommodating recent increases in demand is also considered to be an important theme. In order to respond to this theme, for example, piperazine is used for improving a polishing rate in a polishing composition disclosed in Patent Document 1.

However, a polishing pad used to polish a semiconductor substrate becomes clogged readily due to repeated use, and the clogging may reduce the processing efficiency of the semiconductor substrate and degrade the surface quality of the semiconductor substrate. When the polishing pad becomes clogged, the polishing process must be interrupted and removal of clogging by dressing or exchange of the polishing pad must be performed, thereby lowering the manufacturing efficiency of the semiconductor substrate. Therefore, for example with the polishing composition disclosed in Patent Document 2, a mixed solvent of water and alcohol is used for preventing aggregation and sedimentation of polishing particles in the polishing composition and suppressing precipitation of piperazine, which is used as a polishing promoter in the polishing composition.

However, clogging of the polishing pad occurs not only due to components in the polishing composition used but may also occur due to polishing debris generated from the semiconductor substrate by the polishing of the semiconductor substrate. With the polishing compositions disclosed in Patent Documents 1 and 2, it is difficult to prevent the clogging of the polishing pad caused by the polishing debris.

PRIOR ART DOCUMENTS

Patent Document 1: Japanese Laid-Open Patent Publication No. 05-154760
Patent Document 2: Japanese Laid-Open Patent Publication No. 2004-335722

SUMMARY OF THE INVENTION

Problems that the Invention is to Solve

The present invention is based on a finding, resulting from diligent research by the inventors, that clogging of a polishing pad caused by polishing debris generated from a semiconductor substrate can be prevented by using a polishing composition containing abrasive grains, at least one type of alcohol compound selected from the group consisting of aliphatic alcohols with 2 to 6 carbon atoms and glycol ethers with 3 to 10 carbon atoms, and at least one type of basic compound selected from the group consisting of quaternary ammonium salts and alkali metal salts. An objective of the present invention is to provide a polishing composition capable of being used more favorably in polishing of a semiconductor substrate and a method for polishing a semiconductor substrate using such a polishing composition.

Means for Solving the Problems

To achieve the above objective and in accordance with one aspect of the present invention, a polishing composition is provided containing abrasive grains, at least one type of alcohol compound selected from the group consisting of aliphatic alcohols with 2 to 6 carbon atoms and glycol ethers with 3 to 10 carbon atoms, at least one type of basic compound selected from the group consisting of quaternary ammonium salts and alkali metal salts, and water, wherein the abrasive grains have an average primary particle diameter of 5 to 50 nm, and the alcohol compound is contained in the polishing composition in an amount of 0.01 to 1% by mass.

In accordance with another aspect of the present invention, a method for polishing a semiconductor substrate surface using the polishing composition of the above aspect is provided.

MODES FOR CARRYING OUT THE INVENTION

An embodiment of the present invention will now be described.

A polishing composition according to the present embodiment is prepared by mixing abrasive grains, an alcohol compound, and a basic compound in water. The polishing composition thus contains abrasive grains, an alcohol compound, a basic compound, and water. The polishing composition is mainly used in an application of polishing the surface of a semiconductor substrate, such as a silicon wafer, and is particularly used in preliminary polishing, such as primary polishing or secondary polishing, performed on a semiconductor substrate surface before final polishing.

<Abrasive Grains>

The abrasive grains contained in the polishing composition have a function of physically polishing a semiconductor substrate surface.

Examples of abrasive grains that can be used include silicon dioxide, alumina, ceria, zirconia, diamond, and silicon carbide, although not limited thereto. In particular, use of silicon dioxide, such as colloidal silica, fumed silica, and sol-gel derived silica, is preferable in that the roughness of the semiconductor substrate surface is reduced more than in cases of using other types of abrasive grains. Also, use of colloidal silica or fumed silica and especially use of colloidal silica is preferable in that scratches formed on the semiconductor substrate surface are lessened. One type of abrasive grains may be used alone or two or more types may be used in combination.

The abrasive grains used may have spherical shapes or may have non-spherical shapes. Examples of a non-spherical shape include a so-called cocoon shape having a constriction at a central portion and a spherical shape with a plurality of protrusions on its surface, although not limited thereto. Use of abrasive grains of non-spherical shapes is preferable in that the polishing rate is more improved. Two or more types of abrasive grains differing in shape may be used in combination.

The abrasive grains used is required to have an average primary particle diameter of no less than 5 nm, which is determined from the specific surface area measured by a method (BET method) for measuring a specific surface area of a powder by gas adsorption. It is not practical for the average primary particle diameter to be less than 5 nm because the stability of the polishing composition is impaired.

Also the average primary particle diameter of the abrasive grains is required to be no more than 50 nm, is preferably no more than 35 nm, and is more preferably no more than 20 nm. In a case where the average primary particle diameter exceeds 50 nm, clogging of the polishing pad caused by the abrasive grains may worsen.

<Alcohol Compound>

The alcohol compound contained in the polishing composition is at least one type of compound selected from the group consisting of aliphatic alcohols with 2 to 6 carbon atoms and glycol ethers with 3 to 10 carbon atoms. The alcohol compound adsorbs to the semiconductor substrate surface during polishing to adjust the rate of polishing of the semiconductor substrate with the polishing composition and thereby functions to suppress clogging of the polishing pad caused by polishing debris generated from the semiconductor substrate.

Examples of aliphatic alcohols with 2 to 6 carbon atoms include ethanol, 1-propanol, 2-propanol, 1-butanol, 2-butanol, tert-butanol, pentanol, hexanol, ethylene glycol, propylene glycol, 1,3-butanediol, 1,4-butanediol, 1,5-pentanediol, 1,6-hexanediol, glycerin, 1,2,4-butanetriol, 1,2,6-hexanetriol, erythritol, D-threitol, L-threilol, D-arabinitol, L-arabinitol, ribitol, xylitol, mannitol, and sorbitol. Among these, ethanol, 1-propanol, 2-propanol, 1-butanol, pentanol, ethylene glycol, propylene glycol, 1,3-butanediol, 1,4-butanediol, 1,5-pentanediol, 1,6-hexanediol, glycerin, 1,2,4-butanetriol, and 1,2,6-hexanetriol, which are monovalent to trivalent alcohols, are preferable, and ethanol, 1-propanol, and 2-propanol are more preferable. Also, from a standpoint of improving the polishing rate with the polishing composition, ethanol is most preferable, and from a standpoint of improving a slurry stability of the polishing composition, 1-propanol and 2-propanol are most preferable.

Examples of glycol ethers with 3 to 10 carbon atoms include methyl glycol, methyl diglycol, methyl triglycol, isopropyl glycol, isopropyl diglycol, butyl glycol, butyl diglycol, butyl triglycol, isobutyl glycol, isobutyl diglycol, hexyl glycol, hexyl diglycol, 2-ethylhexyl glycol, 2-ethylhexyl diglycol, aryl glycol, phenyl glycol, phenyl diglycol, benzyl glycol, methylpropylene glycol, methylpropylene diglycol, methylpropylene triglycol, propylpropylene glycol, propylpropylene diglycol, butylpropylene glycol, butylpropylene diglycol, and phenylpropylene glycol. Among these, methyl glycol, methyl diglycol, isopropyl glycol, aryl glycol, and methylpropylene glycol are preferable, and methyl diglycol is more preferable.

In comparison to aliphatic alcohols with 2 to 6 carbons, glycol ethers with 3 to 10 carbon atoms have an advantage of having an action of improving the stability of the polishing composition.

Methanol, which is an aliphatic alcohol with 1 carbon atom, is low in ability to adsorb to the semiconductor substrate surface due to being low in molecular weight and therefore does not have a function of suppressing the clogging of the polishing pad. Also, an aliphatic alcohol with no less than 7 carbon atoms cannot be used favorably due to being difficult to dissolve in water.

A glycol ether with no more than 2 carbon atoms is not available for industrial use. A glycol ether with no less than 11 carbon atoms cannot be used favorably due to being difficult to dissolve in water.

The content of the alcohol compound in the polishing composition is required to be no less than 0.01% by mass, is preferably no less than 0.02% by mass, and is more preferably no less than 0.05% by mass. In a case where the alcohol compound content is less than 0.01% by mass, an amount of the alcohol compound adsorbed to the semiconductor substrate surface during polishing is low and suppression of polishing pad clogging by the alcohol compound is thus insufficient.

Also the content of the alcohol compound in the polishing composition is required to be no more than 1% by mass and is preferably no more than 0.07% mass. An alcohol compound content exceeding 1% by mass is not practical in that the polishing rate decreases significantly.

<Basic Compound>

The basic compound contained in the polishing composition is at least one type of basic compound selected from the group consisting of quaternary ammonium salts and alkali metal salts. The basic compound has a function of chemically polishing the semiconductor substrate. Also, the basic compound has a high ability to disperse polishing debris generated from the semiconductor substrate and therefore also has a function of suppressing clogging of the polishing pad caused by the polishing debris.

Examples of quaternary ammonium salts include hydroxides, carbonates, and bicarbonates of quaternary ammonium, and more specifically include tetramethylammonium hydroxide, tetramethylammonium carbonate, and tetramethylammonium bicarbonate. Among these, tetramethylammonium hydroxide is preferable from a standpoint of improving the polishing rate with the polishing composition.

Examples of alkali metal salts include hydroxides, carbonates, and bicarbonates of alkali metals, and more specifically include potassium hydroxide, sodium hydroxide, potassium bicarbonate, potassium carbonate, sodium bicarbonate, and sodium carbonate. Among these, potassium salts are preferable for reducing metal contamination of the semiconductor substrate after polishing and among potassium salts, potassium hydroxide, potassium bicarbonate, and potassium carbonate are more preferable and potassium hydroxide and potassium carbonate are even more preferable.

In a case where a quaternary ammonium salt and an alkali metal salt are used in combination, a polishing composition with which improvement of the polishing rate and reduction of metal contamination of the semiconductor substrate after polishing are well-balanced can be obtained.

The content of the basic compound in the polishing composition is preferably no less than 0.001% by mass and more preferably no less than 0.15% by mass. As the basic compound content increases, the rate of polishing of the semiconductor substrate with the polishing composition improves.

Also, the content of the basic compound in the polishing composition is preferably no more than 0.5% by mass and more preferably no more than 0.2% by mass. As the basic compound content decreases, the surface roughness of the semiconductor substrate after polishing decreases.

The pH of the polishing composition is preferably no less than 8.5 and more preferably no less than 10.0. When the pH of the polishing composition is no less than 8.5 and moreover when the pH is no less than 10.0, a polishing rate of an especially favorable level in terms of practical use can be obtained readily.

Also, the pH of the polishing composition is preferably no more than 11.5 and more preferably no more than 11.0. When the pH of the polishing composition is no more than 11.5 and moreover when the pH is no more than 11.0, a polishing rate of an especially favorable level in terms of practical use can also be obtained readily.

A pH adjuster may be used to adjust the pH of the polishing composition to a desired value. The basic compound may also be used as a pH adjuster.

<Water>

The water contained in the polishing composition has a function of dissolving or dispersing the other components in the polishing composition. Preferably, the water is, as far as possible, free of impurities that inhibit the actions of the other components. Specifically, ion-exchanged water, with which impurity ions have been removed using an ion exchange resin and foreign matter has thereafter been removed by passage through a filter, pure water, ultrapure water, and distilled water are preferable.

Examples of the semiconductor wafer polished using the polishing composition include silicon wafers, germanium wafers, silicon-germanium wafers, and compound semiconductor (GaAs, InAs, GaN) wafers, although not limited thereto. Among these, the polishing composition is favorably used in an application of polishing a silicon wafer, a germanium wafer, a silicon-germanium wafer, and a GaAs wafer, which are chemically polished readily by the basic compound, and is especially favorably used in an application of polishing a silicon wafer.

When a semiconductor substrate surface is to be polished using the polishing composition, the semiconductor substrate and a polishing pad are rotated in a state where the polishing pad is pressed against the semiconductor substrate surface while the polishing composition is being supplied to the semiconductor substrate surface. In this process, the semiconductor substrate surface is polished by a physical action due to friction between the polishing pad and the semiconductor substrate surface or friction between the abrasive grains in the polishing composition and the semiconductor substrate surface and a chemical action due to the basic compound in the polishing composition.

The polishing composition may be a single component type or a multiple component type, such as a two-component type. In a case of a two-component type polishing composition, it may be provided in a form of a kit including a first component containing the abrasive grains and the basic compound and a second component containing the alcohol compound. The first component and the second component may be mixed mutually in advance and then supplied to a polishing machine or the first component and the second component may be supplied to the polishing machine separately. In a case where the first component and the second component are supplied to the polishing machine separately, it is preferable for the first component to be supplied to the substrate surface continuously from a start of polishing of the substrate surface and thereafter, and for the second component to be supplied only after the start of polishing of the substrate surface.

The polishing composition used in polishing the semiconductor substrate surface may be recovered and reused (put into cyclical use). More specifically, the used polishing composition discharged from the polishing machine may be recovered once in a tank and then supplied from the tank to the polishing machine again. In this case, a need to treat the used polishing composition as a waste liquid is lessened and reduction of environmental load and reduction of cost are made possible.

In putting the polishing composition into cyclical use, a reduced amount of at least any one of the abrasive grains, the alcohol compound, and the basic compound in the polishing composition that are consumed or lost by being used in polishing the semiconductor substrate surface may be replenished. The replenishment may be performed by adding the abrasive grains, the alcohol compound, or the basic compound to the used polishing composition or by adding a mixture containing at least two of the abrasive grains, the alcohol compound, and the basic compound at suitable concentrations to the used polishing composition.

The following advantages are provided by the present embodiment.

A polishing composition according to the present embodiment contains an alcohol compound that adsorbs to a semiconductor substrate surface during polishing and can thereby adjust the rate of polishing of the semiconductor substrate with the polishing composition. A basic compound that has a high ability to disperse polishing debris generated from the semiconductor substrate is also contained. Therefore by the present polishing composition, clogging of the polishing pad caused by polishing debris generated from the semiconductor substrate can be suppressed. The present polishing composition can thus be used favorably in an application of polishing a semiconductor substrate surface and particularly in preliminary polishing that is performed on a semiconductor substrate surface before final polishing.

The above embodiment may be modified as follows.

The polishing composition according to the embodiment may further contain a chelating agent. In a case where a chelating agent is contained, metal contamination of the semiconductor substrate by the polishing composition can be suppressed. Examples of chelating agents that can be used include aminocarboxylic acid chelating agents and organophosphonic acid chelating agents. Examples of aminocarboxylic acid chelating agents include ethylenediaminetetraacetic acid, sodium ethylenediaminetetraacetate, nitrilotriacetic acid, sodium nitrilotriacetate, ammonium nitrilotriacetate, hydroxyethylethylenediaminetriacetic acid, sodium hydroxyethylethylenediaminetriacetate, diethylenetriaminepentaacetic acid, sodium diethylenetriaminepentaacetate, triethylenetetraminehexaacetic acid, and sodium triethylenetetraminehexaacetate. Examples of organophosphonic acid chelating agents include 2-aminoethylphosphonic acid, 1-hydroxyethylidene-1,1-diphosphonic acid, aminotri(methylenephosphonic acid), ethylenediaminetetrakis (methylenephosphonic acid), diethylenetriaminepenta (methylenephosphonic acid), ethane-1,1-diphosphonic acid, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, and α-methylphosphonosuccinic acid.

The polishing composition according to the embodiment may further contain as necessary, a known additive, such as a preservative.

The polishing composition according to the embodiment may be in a concentrated state during manufacture and during marketing. That is, the polishing composition according to the embodiment may be manufactured and marketed in a form of an undiluted polishing composition.

The polishing composition according to the embodiment may be prepared by diluting the undiluted polishing composition with water.

As the polishing pad used in polishing the semiconductor substrate surface with the polishing composition according to the embodiment, any type of polishing pad, such as a polyurethane type, non-woven fabric type, and suede type, may be used and a type containing abrasive grains or a type not containing abrasive grains may be used.

Next, Examples and Comparative Examples of the present invention will be described.

Each of polishing compositions of Examples 1 to 31 was prepared by mixing abrasive grains, an alcohol compound, a basic compound, and, where necessary, a chelating agent in ion-exchanged water. Each of polishing compositions of Comparative Examples 1 to 10 was prepared by mixing all or some of abrasive grains, an alcohol compound, a basic compound, and a chelating agent in ion-exchanged water. Details of the components other than water in the respective polishing compositions of Examples 1 to 31 and Comparative Examples 1 to 10 are shown in Table 1.

Polishing under first polishing conditions indicated below was performed using each of the polishing compositions of Examples 1 to 26 and 29 to 31 and Comparative Examples 1 to 10. Also, polishing under second polishing conditions indicated below was performed using each of the polishing compositions of Examples 27 and 28.

<First Polishing Conditions>

Polishing machine: single-side polishing machine SPM-15, made by Fujikoshi Machinery Corp., with four ceramic plates, Object to be polished: silicon wafers, each having a 6-inch (approximately 150 mm) diameter, being of a p-conductive type, having a <100> crystal orientation, and having a resistivity of no less than 0.1 Ω·cm and less than 100 Ω·cm, with four of the wafers being fixed by wax to each ceramic plate, Polishing load: 32 kPa, Rotation speed of platen: 38 $min^{-1}$ (38 rpm), Rotation speed of ceramic plate: 35 $min^{-1}$ (35 rpm), Polishing pad: Suba 800, made by Rodel, Inc., was used from the beginning to the end without dressing, Usage conditions of polishing composition: cyclical use at a supplying rate of 0.004 $m^3$ (4L) per minute, pH control of polishing composition during cyclical use: the pH was maintained at 10.5 using a 1 normal potassium hydroxide aqueous solution, Polishing time: 30 minutes per batch, Maintained temperature of polishing composition: 27° C.

<Second Polishing Conditions>

Polishing machine: same as the first polishing conditions,

Object to be polished: same as the first polishing conditions,

Polishing load: same as the first polishing conditions,

Rotation speed of platen: same as the first polishing conditions,

Rotation speed of ceramic plate: same as the first polishing conditions,

Polishing pad: same as the first polishing conditions,

Usage conditions of polishing composition: same as the first polishing conditions, pH control of polishing composition during cyclical use: the pH was maintained at 10.5 using a 1 normal potassium hydroxide aqueous solution containing 1% by mass of ethanol, Polishing time: same as the first polishing conditions, Maintained temperature of polishing composition: same as the first polishing conditions.

<Calculation and Evaluation of Polishing Rate>

A thickness of a central portion of each of the silicon wafers polished using the respective polishing compositions of Examples 1 to 31 and Comparative Examples 1 to 10 was measured before and after polishing. The polishing rate was then calculated by dividing a difference of the thicknesses before and after polishing by the polishing time (30 minutes). Values of the polishing rates calculated for the polishing of the first batch are shown in the "Polishing rate" column of Table 1. Results of evaluation of the calculated values according to a five-point scale of A to E are also shown in the same column. "A" indicates that the polishing rate was higher than 0.8 μm/minute, "B" indicates that the polishing rate was no more than 0.8 μm/minute and higher than 0.7 μm/minute, "C" indicates that the polishing rate was no more than 0.7 μm/minute and higher than 0.5 μm/minute, and "D" indicates that the polishing rate was no more than 0.5 μm/minute. "X" indicates that evaluation was not possible because the alcohol compound used did not dissolve in the polishing composition and further use of the polishing composition was interrupted.

<Calculation and Evaluation of Cumulative Polishing Removal Amount>

Batches were polished repeatedly until the polishing rate decreased to 80% of the value of the polishing rate calculated for the polishing of the first batch, and a total of amounts removed by polishing of all batches up to the last batch was calculated. The calculated values are shown in the "Cumulative polishing removal amount" column of Table 1. Results of evaluation of the calculated values according to a five-point scale of A to E are also shown in the same column. "A" indicates that the cumulative polishing removal amount was greater than 3000 μm, "B" indicates that the cumulative polishing removal amount was no more than 3000 μm and greater than 2500 μm, "C" indicates that the cumulative polishing removal amount was no more than 2500 μm/minute and greater than 1700 μm, "D" indicates that the cumulative polishing removal amount was no more than 1700 μm/minute and greater than 1500 μm, and "E" indicates that the cumulative polishing removal amount was no more than 1500 μm. "X" indicates that evaluation was not possible because the alcohol compound used did not dissolve in the polishing composition and further use of the polishing composition was interrupted. The value of the polishing rate decreases as more batches are polished due to progress of clogging of the polishing pad. Therefore, a greater value of the cumulative polishing removal amount indicates that the progress of clogging of the polishing pad was slower.

<Measurement and Evaluation of Surface Roughness>

The surface roughness of the silicon wafer after polishing of the first batch was measured by TMS-3000-WRC, made by Schmitt Measurement Systems. Inc. The measured values are shown in the "Surface roughness" column of Table 1. Results of evaluation of the measured values according to a five-point scale of A to E are also shown in the same column. "A" indicates that the surface roughness was less than 5.5 Å, "B" indicates that the surface roughness was no less than 5.5 Å and less than 6.0 Å, "C" indicates that the surface roughness was no less than 6.0 Å and less than 6.5 Å, "D" indicates that the surface roughness was no less than 6.5 Å and less than 7.0 Å, and "E" indicates that the surface roughness was no less than 7.0 Å. "X" indicates that evaluation was not possible because the alcohol compound used did not dissolve in the polishing composition and further use of the polishing composition was interrupted.

<Evaluation of Stability>

A 10-times concentrate of each of the polishing compositions of Examples 1 to 31 and Comparative Examples 1 to 10 was stored at 25° C., and after 1 month of storage, a diluted solution, obtained by diluting the concentrate by 10 times with ion-exchanged water, was used to calculate the value of the polishing rate by the same method described in the <Calculation and evaluation of polishing rate> section. Results of evaluation of the calculated values according to a five-point scale of A to E are shown in the "Stability" column of Table 1. "A" indicates that the calculated value was no less than −10% to less than +10% with respect to the value indicated in the "Polishing rate" column and "B" indicates that the calculated value was no less than −20% to less than −10% or no less than +10% to less than 20%. "X" indicates that evaluation was not possible because the alcohol compound used did not dissolve in the polishing composition and further use of the polishing composition was interrupted.

TABLE 1

| | Abrasive Grains | | | Basic compound | | Alcohol compound | | Chelating agent | | Polishing condition | Polishing rate | | Cumulative polishing removal amount | | Surface roughness | | Stability |
|---|---|---|---|---|---|---|---|---|---|---|---|---|---|---|---|---|---|
| | Primary particle diameter (nm) | Shape | Concentration (% by mass) | Type | Concentration (% by mass) | Type | Concentration (% by mass) | Type | Concentration (% by mass) | | Calculated value (μm/minute) | Evaluation | Calculated value (μm) | Evaluation | Measurement value (Å) | Evaluation | |
| Ex. 1 | 35 | A | 2 | TMAH | 0.2 | Ethanol | 0.10 | DTPA | 0.05 | 1 | 0.78 | B | 2900 | B | 6.2 | C | B |
| Ex. 2 | 35 | A | 2 | TMAH | 0.2 | 1-propanol | 0.10 | DTPA | 0.05 | 1 | 0.80 | B | 2700 | B | 6.2 | C | A |
| Ex. 3 | 35 | A | 2 | TMAH | 0.2 | 2-propanol | 0.05 | DTPA | 0.05 | 1 | 0.84 | A | 1850 | C | 6.3 | C | A |
| Ex. 4 | 35 | A | 2 | TMAH | 0.2 | 2-propanol | 0.10 | DTPA | 0.05 | 1 | 0.78 | B | 2450 | B | 6.2 | C | A |
| Ex. 5 | 35 | A | 2 | TMAH | 0.2 | 2-propanol | 0.20 | DTPA | 0.05 | 1 | 0.70 | C | 2600 | B | 6.1 | C | A |
| Ex. 6 | 35 | A | 2 | TMAH | 0.2 | 2-propanol | 0.30 | DTPA | 0.05 | 1 | 0.62 | C | 2800 | B | 6.1 | C | A |
| Ex. 7 | 35 | A | 2 | TMAH | 0.2 | 2-propanol | 1.00 | DTPA | 0.05 | 1 | 0.51 | C | 3250 | A | 6.1 | C | B |
| Ex. 8 | 35 | A | 2 | TMAH | 0.2 | 1-pentanol | 0.10 | DTPA | 0.05 | 1 | 0.82 | A | 1900 | C | 6.4 | C | B |
| Ex. 9 | 35 | A | 2 | TMAH | 0.2 | Ethylene glycol | 0.10 | DTPA | 0.05 | 1 | 0.80 | B | 2150 | C | 6.3 | C | B |
| Ex. 10 | 35 | A | 2 | TMAH | 0.2 | Propylene glycol | 0.10 | DTPA | 0.05 | 1 | 0.80 | B | 2000 | C | 6.3 | C | A |
| Ex. 11 | 35 | A | 2 | TMAH | 0.2 | Glycerin | 0.10 | DTPA | 0.05 | 1 | 0.80 | B | 1900 | C | 6.0 | B | B |
| Ex. 12 | 35 | A | 2 | KOH | 0.15 | Ethanol | 0.10 | DTPA | 0.05 | 1 | 0.53 | C | 3400 | A | 5.5 | B | B |
| Ex. 13 | 35 | A | 2 | KOH | 0.15 | 1-propanol | 0.10 | DTPA | 0.05 | 1 | 0.54 | C | 3300 | A | 5.3 | A | A |
| Ex. 14 | 35 | A | 2 | KOH | 0.15 | 2-propanol | 0.10 | DTPA | 0.05 | 1 | 0.60 | C | 3300 | A | 5.1 | A | A |
| Ex. 15 | 12 | A | 2 | KOH | 0.15 | Glycerin | 0.10 | DTPA | 0.05 | 1 | 0.52 | C | 3800 | A | 5.0 | A | A |
| Ex. 16 | 35 | A | 2 | K$_2$CO$_3$ | 1 | Ethanol | 0.10 | DTPA | 0.05 | 1 | 0.61 | C | 2800 | B | 5.2 | A | A |
| Ex. 17 | 35 | A | 2 | TMAH | 0.2 | Ethanol | 0.10 | EDTA | 0.05 | 1 | 0.78 | B | 2900 | B | 5.4 | A | B |
| Ex. 18 | 35 | A | 2 | TMAH | 0.2 | Ethanol | 0.10 | TTHA | 0.05 | 1 | 0.78 | B | 2450 | C | 6.2 | C | B |
| Ex. 19 | 35 | A | 2 | TMAH | 0.2 | Ethanol | 0.10 | EDTPO | 0.05 | 1 | 0.78 | B | 2450 | C | 6.2 | C | B |
| Ex. 20 | 35 | A | 2 | TMAH | 0.2 | Ethanol | 0.10 | — | 0 | 1 | 0.78 | B | 2450 | C | 6.2 | C | B |
| Ex. 21 | 35 | A | 2 | TMAH | 0.2 | Ethanol | 0.10 | DTPA | 0.05 | 1 | 0.51 | C | 3100 | A | 6.0 | C | B |
| Ex. 22 | 35 | B | 2 | TMAH | 0.2 | Ethanol | 0.10 | DTPA | 0.05 | 2 | 0.80 | B | 2900 | B | 6.2 | C | B |
| Ex. 23 | 30 | C | 2 | TMAH | 0.2 | Ethanol | 0.10 | DTPA | 0.05 | 1 | 0.82 | A | 3100 | A | 6.1 | C | A |
| Ex. 24 | 17 | C | 2 | TMAH | 0.2 | Ethanol | 0.10 | DTPA | 0.05 | 1 | 0.89 | A | 3700 | A | 6.0 | C | A |
| Ex. 25 | 12 | A | 2 | TMAH | 0.2 | Ethanol | 0.10 | DTPA | 0.05 | 1 | 0.85 | A | 3800 | A | 6.0 | C | A |
| Ex. 26 | 5 | A | 2 | TMAH | 0.2 | Ethanol | 0.10 | DTPA | 0.05 | 1 | 0.84 | A | 1900 | C | 6.3 | C | B |
| Ex. 27 | 35 | A | 2 | TMAH | 0.2 | — | 0.00 | DTPA | 0.05 | 1 | 0.78 | B | 3050 | A | 6.0 | C | B |
| Ex. 28 | 35 | A | 2 | TMAH | 0.2 | Ethanol | 0.10 | DTPA | 0.05 | 1 | 0.78 | B | 2900 | B | 6.2 | C | A |
| Ex. 29 | 35 | A | 2 | TMAH | 0.2 | Methyl glycol | 0.10 | DTPA | 0.05 | 1 | 0.56 | C | 3000 | B | 6.1 | C | A |
| Ex. 30 | 35 | A | 2 | TMAH | 0.2 | Butyl glycol | 0.10 | DTPA | 0.05 | 1 | 0.61 | B | 2900 | B | 6.1 | C | A |
| Ex. 31 | 35 | A | 2 | TMAH | 0.2 | Butyl diglycol | 0.10 | DTPA | 0.05 | 1 | 0.84 | A | 1700 | C | 6.8 | D | A |
| Com. Ex. 1 | 35 | A | 2 | TMAH | 0.2 | — | 0.00 | DTPA | 0.05 | 1 | 0.53 | C | 2500 | C | 6.5 | D | A |
| Com. Ex. 2 | 35 | A | 2 | KOH | 0.15 | — | 0.00 | DTPA | 0.05 | 1 | 0.65 | C | 2250 | C | 6.5 | D | A |
| Com. Ex. 3 | 35 | A | 2 | K$_2$CO$_3$ | 1 | — | 0.00 | DTPA | 0.05 | 1 | 0.80 | B | 1700 | D | 6.3 | C | B |
| Com. Ex. 4 | 35 | A | 2 | TMAH | 0.2 | Methanol | 0.10 | DTPA | 0.05 | 1 | 0.43 | D | 3300 | A | 6.0 | C | B |
| Com. Ex. 5 | 35 | A | 2 | TMAH | 0.2 | 2-propanol | 1.20 | DTPA | 0.05 | 1 | — | X | — | X | — | X | X |
| Com. Ex. 6 | 35 | A | 2 | TMAH | 0.2 | 1-octanol | 0.10 | DTPA | 0.05 | 1 | — | X | — | X | — | X | X |
| Com. Ex. 7 | 35 | A | 2 | PIZ | 0.5 | — | 0.00 | DTPA | 0.05 | 1 | 1.07 | A | 1250 | E | 8.5 | E | A |
| Com. Ex. 8 | 35 | A | 2 | PIZ | 0.5 | 2-propanol | 0.10 | DTPA | 0.05 | 1 | 1.05 | A | 1400 | E | 7.5 | E | A |

TABLE 1-continued

| | Abrasive Grains | | | Basic compound | | Alcohol compound | | Chelating agent | | Polishing condition | Polishing rate | | | Cumulative polishing removal amount | | | Surface roughness | | Stability |
|---|---|---|---|---|---|---|---|---|---|---|---|---|---|---|---|---|---|---|---|
| | Primary particle diameter (nm) | Shape | Concentration (% by mass) | Type | Concentration (% by mass) | Type | Concentration (% by mass) | Type | Concentration (% by mass) | | Calculated value (μm/minute) | Evaluation | | Calculated value (μm) | Evaluation | | Measurement value (Å) | Evaluation | |
| Com. Ex. 9 | 35 | A | 2 | TETA | 0.5 | 2-propanol | 0.10 | DTPA | 0.05 | 1 | 1.21 | A | | 1100 | E | | 8.3 | E | A |
| Com. Ex. 10 | 90 | A | 2 | TMAH | 0.2 | Ethanol | 0.10 | DTPA | 0.05 | 1 | 0.72 | B | | 1400 | E | | 7.2 | E | B |

The values of the average primary particle diameters indicated in the "Abrasive grains" column of Table 1 are values measured by FlowSorb II 2300, made by Micromeritics Instrument Corp. Also in the same "Abrasive grains" column, "A" indicates abrasive grains having a cocoon shape, "B" indicates abrasive grains having a true spherical shape, and "C" indicates abrasive grains having a spherical shape with a plurality of protrusions on its surface.

In the "Basic compound" column of Table 1, "TMAH" indicates tetramethylammonium hydroxide, "KOH" indicates potassium hydroxide, "$K_2CO_3$" indicates potassium carbonate, "PIZ" indicates piperazine anhydrous, and "TETA" indicates triethylenetetramine.

In the "Chelating agent" column of Table 1, "DTPA" indicates diethylenetriaminepentaacetic acid, "EDTA" indicates ethylenediaminetetraacetic acid, "TTHA" indicates triethylenetetraminehexaacetic acid, and "EDPTO" indicates ethylenediaminetetrakismethylenesulfonic acid.

As shown in Table 1, with Examples 1 to 31, the practically satisfactory results of A, B, or C were obtained for all evaluation items. On the other hand, with each of Comparative Examples 1 to 10, practically satisfactory results could not be obtained, with the results for one or more of the evaluation items being D, E, or X.

The respective dilute liquids obtained by preparing 10-times concentrate liquids of Examples 1 to 31 and Comparative Examples 1 to 10 and then diluting the concentrates by 10 times by ion-exchanged water exhibited the same performance as the polishing compositions of Examples 1 to 31 and Comparative Examples 1 to 10.

The invention claimed is:

1. A polishing composition comprising:
   colloidal silica abrasive grains;
   at least one type of alcohol compound selected from the group consisting of aliphatic alcohols with 2 to 6 carbon atoms and glycol ethers with 3 to 10 carbon atoms;
   at least one type of basic compound selected from the group consisting of quaternary ammonium salts and alkali metal salts; and
   water, wherein
   the abrasive grains have an average primary particle diameter of 5 to 50 nm,
   the alcohol compound is contained in the polishing composition in an amount of 0.01 to 1% by mass, and
   the polishing composition has a pH of 8.5 or more and 11.5 or less.

2. The polishing composition according to claim 1, wherein the basic compound is at least one type of compound selected from the group consisting of hydroxides of quaternary ammonium, carbonates of quaternary ammonium, bicarbonates of quaternary ammonium, hydroxides of alkali metals, carbonates of alkali metals, and bicarbonates of alkali metals.

3. The polishing composition according to claim 1, wherein the basic compound is at least one type of compound selected from the group consisting of tetramethylammonium hydroxide, tetramethylammonium carbonate, tetramethylammonium bicarbonate, potassium hydroxide, potassium carbonate, and potassium bicarbonate.

4. The polishing composition according to claim 1, wherein the abrasive grains have a cocoon shape or have a spherical shape with a plurality of protrusions on its surface.

5. The polishing composition according to claim 1, further comprising a chelating agent.

6. A polishing composition kit comprising a first component and a second component that are mixed mutually to obtain a polishing composition, wherein
   the first component contains colloidal silica abrasive grains, at least one type of basic compound selected from the group consisting of quaternary ammonium salts and alkali metal salts, and water,
   the second component contains at least one type of alcohol compound selected from the group consisting of aliphatic alcohols with 2 to 6 carbon atoms and glycol ethers with 3 to 10 carbon atoms,
   the abrasive grains have an average primary particle diameter of 5 to 50 nm,
   the alcohol compound is contained in the polishing composition in an amount of 0.01 to 1% by mass, and
   the polishing composition has a pH or 8.5 or more and 11.5 or less.

7. A method for polishing a semiconductor substrate surface using a polishing composition, wherein
   the polishing composition contains:
   colloidal silica abrasive grains;
   at least one type of alcohol compound selected from the group consisting of aliphatic alcohols with 2 to 6 carbon atoms and glycol ethers with 3 to 10 carbon atoms;
   at least one type of basic compound selected from the group consisting of quaternary ammonium salts and alkali metal salts; and
   water,
   the abrasive grains have an average primary particle diameter of 5 to 50 nm,
   the alcohol compound is contained in the polishing composition in an amount of 0.01 to 1% by mass, and
   the polishing composition has a pH of 8.5 or more and 11.5 or less.

8. The method according to claim 7, wherein the polishing of the semiconductor substrate surface is performed using a polishing machine and while supplying the polishing composition to the substrate surface, and whereas the abrasive grains and the basic compound are supplied to the substrate surface continuously from a start of polishing of the substrate surface and thereafter, the alcohol compound is supplied to the substrate surface only after the start of polishing of the substrate surface.

9. The method according to claim 7, wherein the polishing composition is put into cyclical use.

10. The method according to claim 9, wherein in putting the polishing composition into cyclical use, a reduced amount of at least any one of the abrasive grains, the alcohol compound, and the basic compound in the polishing composition is replenished.

11. The polishing composition according to claim 1, wherein the alcohol compound is contained in the polishing composition in an amount of 0.30% by mass or less.

12. The polishing composition according to claim 1, wherein the basic compound is a quaternary ammonium salt.

* * * * *